US009110122B2

(12) United States Patent
Zibold et al.

(10) Patent No.: US 9,110,122 B2
(45) Date of Patent: *Aug. 18, 2015

(54) DETECTION OF A METAL OR MAGNETIC OBJECT

(75) Inventors: Tobias Zibold, Stuttgart (DE); Andrej Albrecht, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 335 days.

This patent is subject to a terminal disclaimer.

(21) Appl. No.: 13/696,355

(22) PCT Filed: Apr. 15, 2011

(86) PCT No.: PCT/EP2011/056025
§ 371 (c)(1),
(2), (4) Date: Feb. 26, 2013

(87) PCT Pub. No.: WO2011/138151
PCT Pub. Date: Nov. 10, 2011

(65) Prior Publication Data
US 2013/0193959 A1      Aug. 1, 2013

(30) Foreign Application Priority Data

May 7, 2010   (DE) .......................... 10 2010 028 721
Jul. 9, 2010   (DE) .......................... 10 2010 031 147

(51) Int. Cl.
*G01V 3/08*     (2006.01)
*G01R 33/09*    (2006.01)
(Continued)

(52) U.S. Cl.
CPC .......... *G01R 33/091* (2013.01); *G01R 33/0029* (2013.01); *G01V 3/104* (2013.01); *G01V 3/107* (2013.01)

(58) Field of Classification Search
CPC ...... G01B 7/14; G01R 27/2605; G01D 5/145; G01V 3/08
USPC ..................... 324/658, 322, 239, 309, 207.11
See application file for complete search history.

(56) References Cited

U.S. PATENT DOCUMENTS 4,611,169 A       9/1986   Hermann
6,172,499 B1 *    1/2001   Ashe ......................... 324/207.12
(Continued)

FOREIGN PATENT DOCUMENTS

CN        101556253 A      10/2009
CN        101650442 A       2/2010
(Continued)

OTHER PUBLICATIONS

International Search Report corresponding to PCT Application No. PCT/EP2011/056025, mailed May 11, 2012 (German and English language document) (7 pages).

*Primary Examiner* — Tung X Nguyen
*Assistant Examiner* — Alesa Allgood
(74) *Attorney, Agent, or Firm* — Maginot, Moore & Beck LLP

(57) ABSTRACT

A measuring device for detecting a metal object includes two emission coils configured to produce superimposed magnetic fields, a receiving coil in the region of both magnetic fields, and a control device configured to control the emission coils such that a value of a voltage, which is clock synchronized with alternating voltages and which is induced in the emission coils, is minimized. The control device is configured to detect the metal object when a ratio of the alternating voltages does not correspond to a ratio of distances between the receiving coils and the emission coils.

10 Claims, 2 Drawing Sheets

(51) Int. Cl.
*G01V 3/10* (2006.01)
*G01R 33/00* (2006.01)

(56) References Cited

U.S. PATENT DOCUMENTS

| | | | |
|---|---|---|---|
| 6,236,198 B1 * | 5/2001 | Linder | 324/207.17 |
| 2003/0184301 A1 | 10/2003 | Bosnar | |
| 2006/0238199 A1 | 10/2006 | Larsen | |
| 2007/0046288 A1 | 3/2007 | Westersten | |
| 2009/0140729 A1 * | 6/2009 | Roziere | 324/207.17 |
| 2013/0033273 A1 * | 2/2013 | Thoss et al. | 324/654 |
| 2013/0207648 A1 * | 8/2013 | Zibold et al. | 324/232 |
| 2013/0249539 A1 * | 9/2013 | Zibold et al. | 324/228 |

FOREIGN PATENT DOCUMENTS

| | | |
|---|---|---|
| DE | 10 2004 047 189 A1 | 4/2006 |
| DE | 10 2007 053 881 A1 | 5/2009 |
| JP | 2005-140747 A | 6/2005 |

* cited by examiner

DETECTION OF A METAL OR MAGNETIC OBJECT

This application is a 35 U.S.C. §371 National Stage Application of PCT/EP2011/056025, filed on Apr. 15, 2011, which claims the benefit of priority to Serial Nos. DE 10 2010 028 721.0, filed on May 7, 2010 and DE 10 2010 031 147.2, filed on Jul. 9, 2010 in Germany, the disclosures of which are incorporated herein by reference in their entirety.

In certain types of the machining of workpieces, there is the risk that an object hidden in the workpiece will be damaged by the machining. When drilling into a wall, for example, a water, power or gas line running within the wall can be damaged. In the reverse case, it may be desirable to carry out the machining precisely in such a manner that an object hidden in the workpiece is also machined, for example if the hole from the above example is to run through a reinforcement iron or a bearing construction within the wall.

BACKGROUND

In the prior art, coil-based metal detectors are known for detecting such a hidden object. Such detectors generate a magnetic field within an area to be measured. If there is a metallic object in the area to be measured, the object is detected due to its influence on the magnetic field generated. Frequently, at least two receiving coils are used for determining the magnetic field generated which are oriented and connected to one another in such a manner that in the absence of a metallic object in the area to be measured, the measurement signal supplied jointly by both receiving coils tends toward zero (differential measurement). In one variant, a number of transmitting coils are used for generating the magnetic field which are driven in such a manner that the signal measured in the two receiving coils goes to zero independently of a presence of a metallic object in the area to be measured (field-compensated measurement).

DE 10 2007 053 881 A1 describes a measuring method for determining the position or the angle of a coil with respect to two other coils. For this purpose, an alternating magnetic field is generated by means of two transmitting coils arranged at an angle to one another. A receiving coil is brought into the alternating magnetic field and the drive to the transmitting coils is changed in such a manner that the same voltage is induced in the receiving coil by each of the transmitting coils. A ratio of current values supplied to the transmitting coils is used as a measure for a determination of the position and/or angle of the receiving coil with respect to the transmitting coils.

DE 10 2004 047 189 A1 discloses a metal detector having printed coils.

The disclosure is based on the object of providing a simple and accurate detector for a metallic object. A further object of the disclosure consists in specifying a method for determining the metallic object.

SUMMARY

The disclosure achieves these objects by means of a measuring device having the features described below and of a method having the features described below. The description below specifies preferred embodiments.

According to the disclosure, a measuring device for detecting a metallic object comprises two transmitting coils for generating superimposed magnetic fields, a receiving coil in the area of the two magnetic fields and a control device for supplying the transmitting coils with alternating voltages in such a manner that the value of an alternating voltage, which is clock-pulse synchronized with the alternating voltages and which is induced in the receiving coil, is minimized. In this arrangement, the control device is configured for detecting the metallic object when the ratio of the alternating voltages does not correspond to the ratio of the distances of the receiving coil from the transmitting coils.

If the system is disturbed by a metallic object, an alternating voltage, which is clock-pulse synchronized with the alternating voltages, is induced in the receiving coil. The control system is designed for minimizing the value of this clock-pulse synchronized alternating-voltage component (i.e. making it zero). Direct-voltage components or also alternating-voltage components not clock-pulse synchronized due to extraneous interference remain unconsidered. By this means, a susceptibility to interference of the measuring device can be advantageously reduced.

Advantageously, it is thus possible by using only three coils to measure both differentially and in a field-compensated manner. By this means, a production expenditure can be reduced, with the sensitivity of the measuring device being high, which can be associated with cost advantages.

The alternating voltages are preferably mutually phase-shifted alternating voltages for changing the magnetic fields of the transmitting coils periodically in value and phase. The alternating voltages provide for the synchronous demodulation by which means interfering signals having frequencies unequal to the modulation frequency can be very effectively suppressed. In addition, the alternating voltages can generate alternating magnetic fields in order to induce alternating currents in non-magnetic materials such as, e.g. copper, due to which these can then be detected.

The receiving coil can be arranged symmetrically between the transmitting coils. As a result, the sign of the measurement value can be different depending on the direction of approach of the metallic object and on the basis of the sign, a decision can be made as to whether the object is reacted or not. In this manner, faulty measurements can be avoided.

In the area of the magnetic fields of the transmitting coils, a further receiving coil can also be arranged, the control device being configured for supplying the transmitting coils with voltage alternatingly on the basis of the voltage induced in the receiving coil and of the voltage induced in the further receiving coil.

The receiving coil and the further receiving coil can assume different positions with respect to the transmitting coils and/or have different sensitivities due to their shape, extent or structure. With the corresponding structure and arrangement of the transmitting and receiving coils, it can thus be possible to determine a direction, a distance and/or a size of the metallic object by comparative measurements with the several receiving coils.

Although any types of coils can be used, at least one of the coils is preferably an air-core coil. As a result, the measuring device can be constructed in such a manner that it reacts only very weakly to temperature or aging influences as a result of which a calibration can be made once as part of the production of the measuring device.

At least one of the coils is preferably constructed as a printed circuit (printed coil) on a printed circuit board. By this means, a precise production of the one or several printed coils can be implemented with little production expenditure. In this context, the control device can be constructed on the same printed circuit board. By minimizing wiring and equipment costs, further production costs can thus be saved.

It is also conceivable to replace the receiving coil with a magnetic field sensor. For example, a magnetoresistive magnetic field sensor like, for instance, a Hall sensor, can be used.

According to a further aspect of the disclosure, a method for detecting a metallic object comprises the steps of generating superimposed magnetic fields by means of two transmitting coils, determining a voltage induced in a receiving coil in the area of the two magnetic fields, supplying the transmitting coils with alternating voltages in such a manner that the value of an alternating voltage, which is clock-pulse synchronized with the alternating voltages and which is induced in the receiving coil, is minimized, and detecting the metallic object when the ratio of the alternating voltages does not correspond to the ratio of the distances of the receiving coil from the transmitting coils.

The disclosure can also be designed as computer program product wherein a computer program product according to the disclosure comprises program code means for performing the method described and can run on a processing device or can be stored on a computer-readable data medium.

BRIEF DESCRIPTION OF THE DRAWINGS

In the text which follows, the disclosure will be described more accurately with respect to the attached figures, in which.

DETAILED DESCRIPTION

Figure 1:
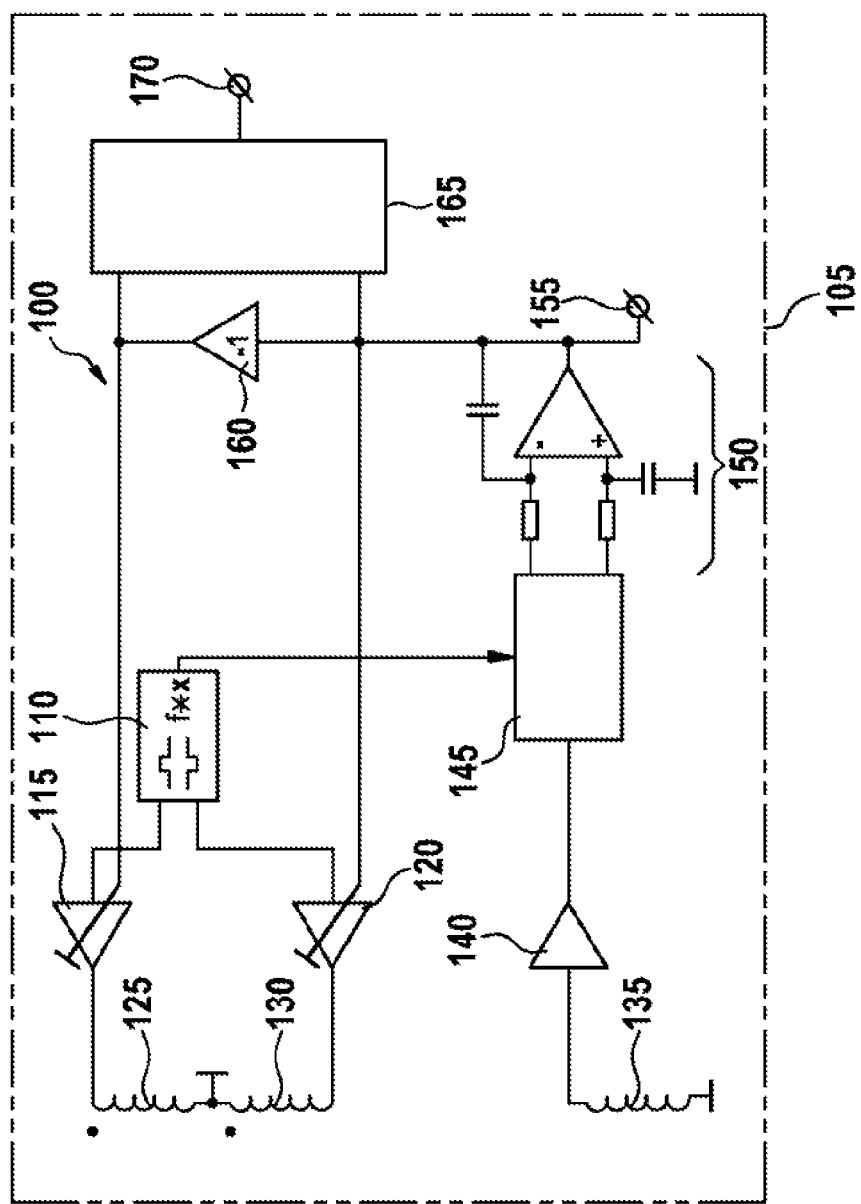
FIG. 1 shows a block diagram of a measuring device.

FIG. 1 shows a block diagram of a measuring device 100. The measuring device 100 is a part of a metal detector 105 for detecting metallic objects, for example made of ferrous material.

A clock generator 110 has two outputs at which it provides phase-shifted periodic alternating signals preferably phase-shifted by 180°. The alternating signals can comprise in particular rectangular, triangular or sinusoidal signals. The outputs of the clock generator are connected to a first controllable amplifier 115 and to a second controllable amplifier 120, respectively. Each of the controllable amplifiers 115, 120 has a control input via which it receives a signal which controls a gain factor of the controllable amplifier 115, 120. One output of the first controllable amplifier 115 is connected to a first transmitting coil 125 and one output of the second controllable amplifier 120 is connected to a second transmitting coil 130. Remaining ends of the transmitting coils 125 and 130 are in each case connected electrically to ground.

As is indicated by the dots at the transmitting coils 125 and 130, the transmitting coils 125 and 130 are oriented in the same direction. When supplied with opposite voltages with respect to ground, the transmitting coils 125, 130 build up magnetic fields having opposite alignments. If there is no object and with a symmetric arrangement of the receiving coil 135 between the transmitting coils 125 and 130, the magnetic flux which passes through the receiving coil 135 is zero and similarly, the voltage induced in the receiving coil 135 is zero. The same effect can also be achieved by corresponding reorientation of the transmitting coils 125, 130 and adapting the polarities of the voltages delivered by the controllable amplifiers 115, 120.

The principle of measurement can be implemented in a not less advantageous manner when the transmitting coils are supplied with voltages which have the same polarity referred to ground. Whereas in the case of a supply with voltages of opposite polarity with a symmetric arrangement of the receiving coil 135 between the transmitting coils 125 and 130 in the case where there is no object, the voltages present at the transmitting coils 125, 130 have approximately the same amplitude during one halfwave, this is not required in a case of a supply with voltages of the same polarity. Instead, it is also conceivable that in the case of a supply with voltages of the same polarity, the amplitudes of the voltages present at the transmitting coils 125, 130 during one halfwave already differ in the case where there is no object and with a symmetric arrangement of the receiving coil 135 between the transmitting coils 125, 130. In the subsequent halfwave, these amplitudes are then present at the respective other transmitting coil 130, 125. In the presence of a metallic object, in contrast, the amplitudes differ at the respective other transmitting coil 130, 125 also in successive halfwaves. In this case, the transmitting coils 125, 130 must be orientated in the same direction so that identically oriented magnetic fields are built up by the two transmitting coils 125, 130. The magnetic flux which passes through the receiving coil 135 is thus constant in time and the voltage induced in the receiving coil 135 is zero.

The further description relates to the exemplary embodiments with opposite polarity of the supply voltages and identically directed orientation of the transmitting coils 125, 130.

A receiving coil 135 is connected with one terminal to ground, the second terminal leads to an input amplifier 140. In a further embodiment, the receiving coil 135 can be replaced by a magnetic field sensor, for example a Hall sensor. The receiving coil can also be connected with its ends to the two inputs of a differential amplifier, the output of the differential amplifier being connected to the input amplifier 140. The input amplifier 140 is represented as having a constant gain factor; in other embodiments, however, a gain factor of the input amplifier 140 can also be controllable. By this means, a spatial resolution and/or sensitivity of the measuring device 100 can be capable of being influenced and, for example, controllable in dependence on a measured quantity.

The output of the input amplifier 140 is connected to a synchronous demodulator 145. The synchronous demodulator 145 is also connected to the clock generator 110 and receives from it a clock signal which indicates the phase angle of the signals provided at the outputs of the clock generator 110. In a simple embodiment in which the signals provided by the clock generator 110 are symmetric rectangular signals, one of the output signals can be used as a clock signal. The synchronous demodulator 145 essentially switches the measurement signal received by the input amplifier 140 alternatingly through at its upper and lower output, respectively, on the basis of the clock signal provided by the clock generator 110.

The two outputs of the synchronous demodulator 145 are connected to an integrator (integrating comparator) 150 which is represented here as an operational amplifier to which two resistors and two capacitors are connected. Other embodiments are also possible, for example as an active low-pass filter. A digital embodiment following the synchronous demodulator 145 is also conceivable in which the signal is analog/digital converted at the output of the synchronous demodulator 145 at one/several time(s) within a halfwave and is then compared with the corresponding value from the next halfwave. The difference is integrated and, e.g., changed again into an analog signal and used for controlling the amplifier. While the synchronous demodulator 145 provides the measurement signal received by the input amplifier 140 at the lower one of its outputs, the integrator 150 integrates this signal with time and provides the result at its output. While the synchronous demodulator 145 provides the measurement signal received from the input amplifier 140 at its upper output, it is integrated inverted with time by the integrator 150 and the result is provided at the output of the integrator 150. The voltage at the output of the integrator 150 is the integral of the difference of the low-pass-filtered outputs of the synchronous demodulator.

The synchronous demodulator considers only induced voltages which are clock-pulse synchronized with the alternating voltages of the controllable amplifiers 115, 120. Direct-voltage components or also alternating voltage components of the induced voltage which are not clock-pulse synchronized remain unconsidered which is why the measuring device is resistant to such disturbances. If a voltage is induced in the receiving coil 135 by the magnetic field of the first transmitting coil 125 which is exactly as large as that from the magnetic field of the second coil 130, the signals provided at the outputs of the synchronous demodulator 145 are equally large with time on average and at the output of the integrator 150 a signal is provided which tends towards zero (ground). If, however, the influence of the magnetic field of one of the transmitting coils 125, 130 predominates, the signals provided at the outputs of the synchronous demodulator 145 are no longer equal on average and a positive or negative signal is provided at the output of the integrator 150.

The voltage induced in the receiving coil 135 is influenced by unequal distances of the receiving coil 135 from the transmitting coils 125, 130. A corresponding influence is produced by unequal amplitudes of the voltages delivered by the transmitting coils 125, 130. Since the position of the receiving coil 135 is invariant with respect to the transmitting coils 125, 130, a predetermined ratio between the amplitudes of the voltages delivered by the controllable amplifiers 115, 120 corresponds to the case where there is no object. If the ratio of the voltages differs from the predetermined ratio, it is possible to assume the existence of the object in the area of the superimposed magnetic fields of the transmitting coils 125, 130.

The signal provided by the integrator 150 is provided for further processing via a terminal 155. In addition, a microcomputer 175 can be connected to the control inputs of the controllable amplifiers 115, 120. The microcomputer 175 compares the provided signal with a threshold value and outputs at an output 180 a signal which indicates the metallic object. The signal can be offered visually and/or audibly to a user of the metal detector 105.

In addition, the microcomputer 175 can carry out further processing of the signals picked up from the control inputs of the controllable amplifiers 115, 120 and, in dependence on these, control parameters of the measuring device 100. For example, a frequency or signal shape of the alternating voltages at the outputs of the clock generator 110 can be varied or a sensitivity of the receiving amplifier 140 can be changed. In a further embodiment, other ones of the elements shown of the measuring device 100 are implemented by the microcomputer 175, for instance the clock generator 110, the synchronous demodulator 145 or the integrator 150.

The same signal of the integrator 150 is also used for controlling the gain factors of the controllable amplifiers 115 and 120, the second controllable amplifier 120 being connected directly to the output of the integrator 150 and the first controllable amplifier 115 being connected to the output of the integrator 150 by means of an inverter 160. The inverter 160 inverts the signal provided to it in such a manner that the gain factor of the first controllable amplifier 115 increases in dependence on the output signal of the integrator 150 to the same extent to which the gain factor of the second controllable amplifier 120 decreases, or conversely, respectively. It is also conceivable that only the gain factor of one of the two controllable amplifiers 115, 120 is controlled while the gain factor of the second controllable amplifier 115, 120 is kept at a fixed value.

Figure 2:
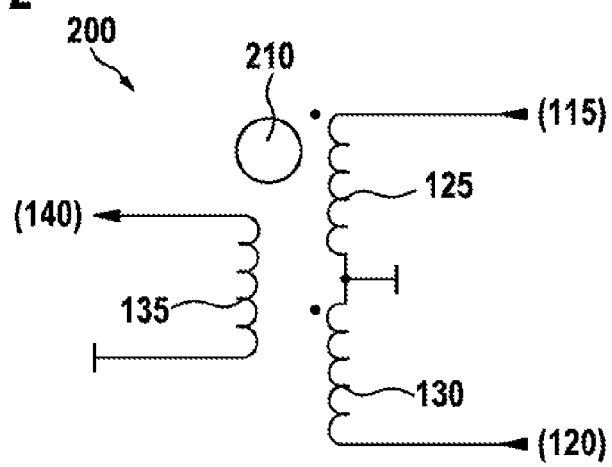
FIG. 2 shows an arrangement of coils and of a metallic object at the measuring device from FIG. 1.

FIG. 2 shows an arrangement 200 of the transmitting coils 125, 130 and of the receiving coil 135 with respect to a metallic object 210 for explaining the principle of measurement of the measuring device 100 from FIG. 1. The transmitting coils 125 and 130 are aligned with respect to one another in such a manner that the directions of their main magnetic fields are flush with one another, the transmitting coils 125, 130 having a certain distance. In the case of transmitting coils 125, 130, the diameter of which is much larger than their length, for example when the transmitting coils 125, 130 are constructed as printed coils, the transmitting coils 125, 130 can be located in planes which are parallel to one another, for instance on opposite surfaces of a printed circuit board in the example of printed coils.

As described above with reference to FIG. 1, the transmitting coils 125, 130 are arranged and connected to one another in such a manner that they generate alternating magnetic fields in dependence on the signals provided by the clock generator 110, the magnetic field of the first transmitting coil 125 being aligned opposite to the magnetic field of the second transmitting coil 130 at any time. The superimposed magnetic fields cancel each other out on an area between the transmitting coils 125 and 130. The receiving coil 135 is arranged in this area, an axis around which the receiving coil 135 is wound preferably being perpendicular to the area. The receiving coil 135 can be flush with the transmitting coils 125, 130 or arranged laterally displaced with respect to the transmitting coils 125, 130. If the transmitting coils 125, 130 are flush with one another, the area is a plane.

A metallic object 210 is located in the area of the magnetic fields of the transmitting coils 125 and 130, a distance of the metallic object 210 from the first transmitting coil 125 being less than from the second transmitting coil 130. The magnetic field of the first transmitting coil 125 is thus influenced more by the metallic object 210 than the magnetic field of the second transmitting coil 130. The receiving coil 135 is exposed correspondingly to magnetic fields of the transmitting coils 125, 130 which are unequally strong so that a resultant magnetic field exists in the area of the receiving coil 135 and a positive voltage is induced in the receiving coil 135. If the metallic object 210 is closer to the second transmitting coil 130 than to the first transmitting coil 125, the differential voltage is correspondingly negative.

The value of the voltage induced in the receiving coil 135 depends on the asymmetry of the magnetic fields of the transmitting coils 125, 130 acting on the receiving coil 135. At the output of the integrator 150, a signal appears, therefore, which depends on the asymmetry of the magnetic fields.

Depending on the output voltage of the integrator 150, the gain factors of the controllable amplifiers 115, 120 are changed in opposite directions so that the transmitting coils 125, 130 are supplied with differently large voltages. The magnetic fields generated by the transmitting coils 125, 130 in the area of the receiving coil 135 then have the same value again and different signs so that the voltage induced in the receiving coil 135 tends towards zero again. The presence of the metallic object 210 in the magnetic fields can be detected due to the deviation from zero of the control signal present at terminal 155. In one embodiment, metallic objects are only detected on the basis of a predetermined sign of the control signal. Thus, objects on one side of the transmitting coils 125, 130 are ignored which may be caused, for example, by a user of the measuring device.

Figure 3:
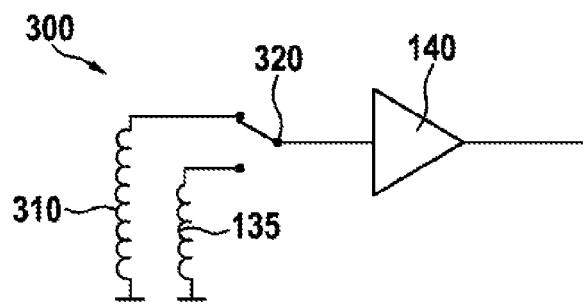
FIG. 3 shows an arrangement of a number of receiving coils for the measuring device from FIG. 1.

FIG. 3 shows an arrangement 300 of a number of receiving coils for the measuring device 100 from FIG. 1. In addition to the receiving coil 135, a further receiving coil 310 is provided. One terminal of the further receiving coil 310 is connected to ground and the other one to a switch 320. The switch 320 selectively connects either the second terminal of the further receiving coil 310 or the second terminal of the receiving coil 135 to the input of the input amplifier 140.

The further receiving coil 310 has more turns than the receiving coil 135 and thus supplies a greater output signal than the receiving coil 135 with a comparable magnetic field. The receiving coils 135 and 310 can be arranged, for example, next to one another or concentrically, for example as printed coils.

In another embodiment, the receiving coils 135 and 310 are identically structured. By providing a corresponding number of further receiving coils 310 in conjunction with a switch 320 with a fitting number of switch positions, a direction, a distance and/or a size of the metallic object 210 can be determinable depending on the arrangement of the receiving coils 135, 310, for example by means of triangulation on the basis of an arrangement of the receiving coils 135, 310.

In one embodiment, a multiplicity of similar receiving coils 135, 310 can be arranged in the plane described above with reference to FIG. 2. The receiving coil 135, 310 which is closest to the metallic object 210 requires the greatest asymmetry of the magnetic fields generated by the transmitting coils 125, 130. It is thus possible to determine by switching over by means of the switch 320 which one of the receiving coils 135, 310 is closest to the metallic object 210 from which a direction of the metallic object 210 with respect to the transmitting coils 125, 130 can be derived.

Figure 4:
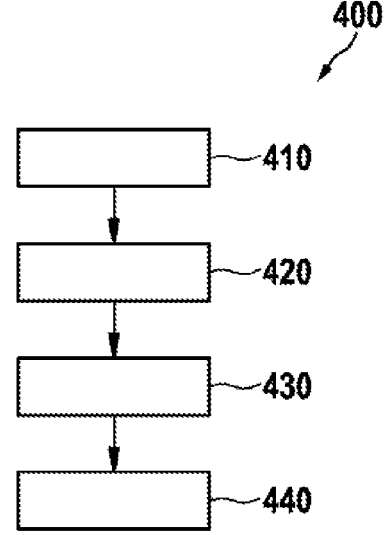
FIG. 4 shows a flowchart of a method for the measuring device from FIG. 1.

FIG. 4 shows a schematic flowchart of a method 400 for detecting a metallic object 210 corresponding to the measuring device 100 from FIGS. 1 and 2. In a step 410, differently oriented alternating magnetic fields are generated by means of the transmitting coils 125, 130. In a step 420, the voltage induced in the receiving coil 135 is determined. In a step 430, the gain factors of the amplifiers 115, 120 are controlled in dependence on the induced voltage determined in step 420, in such a manner that the value of the voltage, which is clock-pulse synchronized with the alternating voltages and which is induced in the receiving coil 135, is minimized. In a concluding step 440, the metallic object 210 is detected on the basis of an asymmetric supply of the transmitting coils 125, 130 with voltage or, respectively, an unequal drive of the amplifiers 115, 120. For this purpose, a comparison is made as to whether the voltage present at terminal 155 exceeds the value of zero by more than a predetermined measure, wherein this measure itself can be an arbitrary value.

The invention claimed is:

1. A measuring device for detecting a metallic object comprising:
    two transmitting coils configured to generate superimposed magnetic fields;
    a receiving coil arranged in an area of the magnetic fields; and
    a control device configured to supply the transmitting coils with alternating voltages such that a value of a voltage, which is clock-pulse synchronized with the alternating voltages and which is induced in the receiving coil, is minimized, wherein the control device is configured to detect the metallic object when a ratio of the alternating voltages does not correspond to a ratio of distances of the receiving coil from the transmitting coils.

2. The measuring device as claimed in claim 1, wherein the alternating voltages are mutually phase-shifted to change the magnetic fields periodically in value and phase.

3. The measuring device as claimed in claim 1, wherein the receiving coil is arranged symmetrically between the transmitting coils.

4. The measuring device as claimed in claim 3, wherein:
    at least one further receiving coil is arranged in the area of the magnetic fields; and
    the control device is configured to supply the transmitting coils with voltage alternatingly based on a voltage induced in the receiving coil and a voltage induced in the further receiving coil.

5. The measuring device as claimed in claim 4, further comprising an evaluating device configured to determine at least one of a direction, a distance, and a size of the metallic object based on the voltages induced in the receiving coil and the further receiving coil.

6. The measuring device as claimed in claim 4, wherein at least one of the transmitting coils and the receiving coil is an air-core coil.

7. The measuring device as claimed in claim 4, wherein at least one of the transmitting coils and the receiving coil is a printed circuit on a printed circuit board.

8. The measuring device as claimed in claim 7, wherein the control device is constructed on the printed circuit board.

9. A method for detecting a metallic object, comprising:
    generating superimposed magnetic fields with two transmitting coils;
    determining a voltage induced in a receiving coil in an area of the magnetic fields;
    supplying the transmitting coils with alternating voltages such that a value of a voltage, which is clock-pulse synchronized with the alternating voltages and which is induced in the receiving coil, is minimized; and
    detecting the metallic object when a ratio of the alternating voltages does not correspond to a ratio of distances of the receiving coil from the transmitting coils.

10. A non-transitory computer readable medium that stores program code for performing a method when run on a processing device, the method comprising:
    generating superimposed magnetic fields with two transmitting coils;
    determining a voltage induced in a receiving coil in an area of the magnetic fields;
    supplying the transmitting coils with alternating voltages such that the value of a voltage, which is clock-pulse synchronized with the alternating voltages and which is induced in the receiving coil, is minimized; and
    detecting the metallic object when a ratio of the alternating voltages does not correspond to a ratio of distances of the receiving coil from the transmitting coils.

* * * * *